United States Patent
Kowaki

(10) Patent No.: US 7,499,556 B2
(45) Date of Patent: Mar. 3, 2009

(54) INTEGRATING APPARATUS

(75) Inventor: Hiroshi Kowaki, Akashi (JP)

(73) Assignee: Fujitsu Ten Limited, Hyogo (JP)

( * ) Notice: Subject to any disclaimer, the term of this patent is extended or adjusted under 35 U.S.C. 154(b) by 0 days.

(21) Appl. No.: 10/913,448

(22) Filed: Aug. 9, 2004

(65) Prior Publication Data

US 2005/0013449 A1    Jan. 20, 2005

Related U.S. Application Data

(63) Continuation of application No. 09/300,381, filed on Apr. 27, 1999, now Pat. No. 6,990,206.

(30) Foreign Application Priority Data

Apr. 27, 1998   (JP)   ............................ 10-117286

(51) Int. Cl.
*H03G 9/00*   (2006.01)
*G06F 7/64*   (2006.01)
*G06G 7/18*   (2006.01)

(52) U.S. Cl. .................. 381/102; 381/86; 327/336; 333/19

(58) Field of Classification Search ............... 381/86, 381/71.4, 107, 56–58, 120, 111, 102, 94.1; 327/336–345; 333/19
See application file for complete search history.

(56) References Cited

U.S. PATENT DOCUMENTS

| 4,640,990 | A | * | 2/1987 | Kawade et al. | ............... | 379/77 |
| 5,065,432 | A | * | 11/1991 | Sasaki et al. | ............... | 381/61 |
| 5,298,845 | A | * | 3/1994 | DeBoer et al. | ............... | 318/609 |
| 5,369,711 | A | | 11/1994 | Williamson, III | | |
| 5,546,132 | A | * | 8/1996 | Kim et al. | ............... | 348/607 |
| 5,550,922 | A | | 8/1996 | Becker | | |
| 5,615,270 | A | | 3/1997 | Miller et al. | | |
| 5,771,297 | A | | 6/1998 | Richardson | | |

FOREIGN PATENT DOCUMENTS

| JP | 58-38010 | 3/1983 |
| JP | 62-269428 | 11/1987 |
| JP | 7-86857 | 3/1995 |
| JP | 9-36683 | 2/1997 |
| JP | 9-116361 | 5/1997 |

\* cited by examiner

*Primary Examiner*—Xu Mei
(74) *Attorney, Agent, or Firm*—Wenderoth, Lind & Ponack, L.L.P.

(57) ABSTRACT

An integrating apparatus to lower the levels of audio outputs of an on-board audio system immediately upon cessation of a noise level such as when a vehicle comes to a stop. Audio signals from an audio source are amplified through attenuating means by an amplifying means to drive a loudspeaker. An output of a microphone for detecting a noise is inputted to each of two integrating circuits, which have different fall time constants. Outputs of the integrating circuits are applied to a selectively outputting means, which selectively derives an output having a lower level among the outputs of the integrating circuits, and which then supplies the output as a control signal to the attenuating means. When the level of noise is high such as when the vehicle is running, the control signal has a high level and the attenuating means reduces an attenuation. Thus, the output of the audio source may be heard without a drift of the audio signal level. When the vehicle stops, the control signal level is lowered immediately, whereby the attenuation of the attenuating means is increased which results in the convergence rate of a fall of the audio output increasing.

5 Claims, 5 Drawing Sheets

INTEGRATING APPARATUS

This application is a continuation application of Ser. No. 09/300,381, filed Apr. 27, 1999 now U.S. Pat. No. 6,990,206.

BACKGROUND OF THE INVENTION

1. Field of the Invention

The present invention relates to an integrating apparatus, and more particularly, to an integrating apparatus suited for use with an on-board audio system, for example.

2. Description of the Related Art

An integrating apparatus is required, for example, by an audio system mounted on an automobile for measuring a noise level with a microphone while the automobile is running, and for reducing an attenuation of audio signals from an audio source, such as a radio receiver, in response to an increase in the noise level so as to raise the level of audio output from a loudspeaker. In the prior art, an output corresponding to the noise level from the microphone is applied to an integrating circuit, and the attenuation of audio signals is varied according to the output from the integrating circuit to determine volume levels. When a small time constant is set for the integrating circuit, the output level of the integrating circuit varies frequently, which results in a drift in the level of audio output from the loudspeaker. In the prior art, therefore, a relatively large time constant is set for the integrating circuit so as to avoid the drift in the audio output level.

The prior art has a disadvantage in that, with the relatively large time constant that is set for the integrating circuit, a long time is taken from the cessation of a noise level signal from the microphone to a lowering of the output level of the integrating circuit. That is, an inconvenience is encountered in which a relatively long time is taken from the lowering of the noise level to the lowering of the audio output level. When the vehicle stops at a toll gate on an expressway, for example, a long time is taken before the lowering of the audio output level. The time taken before the lowering of the audio output level is 5 to 10 seconds, for example.

Another conventional example is disclosed in Japanese Unexamined Patent Publication JP-A 58-38010 (1983). In this prior art example, a microphone detects external noise, and after a rise in the volume of a loudspeaker, the external noise is masked by the speaker sound. This encumbers detection of the actually occurring external noise by the microphone as a result of lowering the volume of the loudspeaker. This prior art example discloses a construction to remedy such a phenomenon. In this prior art example, an integrating circuit is used to avoid the lowering of the volume of the loudspeaker due to the masking of the external noise following a rise in the volume as noted above. This prior art example, however, fails to address the question of reducing the time taken from cessation of a noise level detected by the microphone to the lowering of audio signals from the loudspeaker.

SUMMARY OF THE INVENTION

An object of the present invention is to provide an integrating apparatus which is operable to prevent frequent variations in an integrated output despite variations in input signals, to avoid a drift of the integrated output, and moreover, to quickly reduce the integrated output upon cessation of the input signals to thereby shorten a convergence time of the results of the integration.

Another object of the invention is to provide an audio system particularly suited for on-board use where the audio system is effective to avoid frequent variations in an audio output level in response to noise levels, to avoid a drift of the audio output level, and moreover, to reduce the audio output level upon cessation of the noise levels to thereby shorten a convergence time.

The present invention provides an integrating apparatus comprising:

a plurality of integrating circuits which are each operable to integrate an input signal and to output the integrated input signal; and selecting means for selectively deriving an output having a lowest level from among outputs of the plurality of integrating circuits;

wherein the plurality of integrating circuits have different fall time constants from each other.

In the present invention, it is preferable that the integrating circuits are controlled so that the smaller the fall time constant is, the higher an average value of the output levels is.

The present invention provides an integrating apparatus comprising:

a plurality of integrating circuits which are operable to share input signals, where the plurality of integrating circuits have different fall time constants; and selectively outputting means for selectively deriving an output having a lowest level from among respective outputs of the plurality of integrating circuits.

In the present invention, it is preferable that the number of the plurality of integrating circuits is two.

According to the present invention, the two integrating circuits have different fall time constants from each other and share input signals. The selectively outputting means selectively derives an output having the lowest level from among the outputs of these integrating circuits. Consequently, upon cessation of the input signals, the output from the selectively outputting means is reduced quickly so as to shorten a convergence time for the results of integration. While the input signals of varied levels are applied, the output of the integrating circuit having the smaller fall time constant is output from the selectively outputting means. Thus, the level of output from the selectively outputting means never varies frequently, thereby preventing a drift occurring with the output of the selectively outputting means.

Gains in a steady state of the plurality of integrating circuits, namely amplification factors of first amplifying means, are set so that the smaller the fall time constant is, the higher the amplification factor is, and thus, the higher the integrated output level is. That is, in the steady state, where the common input signals of a fixed level are applied to the plurality of integrating circuits, and a time sufficiently longer than each rise time constant has elapsed, the output levels of the integrating circuits are such that the output level of the integrating circuit having the smaller fall time constant has a larger gain or smaller attenuation factor than the output level of the integrating circuit having the larger fall time constant. The number of the plurality of integrating circuits may be three or more.

According to the present invention, the output level of the selectively outputting means is prevented from varying frequently regardless of any variations in the input signals. This is effective to avoid a drift of the output from the selectively outputting means, and moreover, to increase the fall convergence rate.

In the present invention, it is preferable that the integrating apparatus comprises first amplifying means for amplifying the input signals inputted to the plurality of integrating circuits. It is also preferable that the first amplifying means has amplification factors corresponding to the fall time constants of the integrating circuits to which the input signals are inputted, respectively, where the amplification factor is larger when the fall time constant is smaller.

In the present invention, it is preferable that each of the plurality of integrating circuits comprises:

adding means for adding an input signal and a feedback signal, and then for outputting the added signal;

delaying means for delaying the output of the adding means and then producing the delayed output; and second amplifying means for amplifying the output of the delaying means and then producing the amplified output; wherein the output of the second amplifying means is inputted to the adding means as the feedback signal, and the output of the adding means is produced as the output of the integrating circuit.

In the present invention, it is preferable that the second amplifying means has a gain of less than one.

In the present invention, it is also preferable that the adding means samples and computes the signal at predetermined sampling time intervals.

In the present invention, it is also preferable that the delaying means delays the signal on a timescale of the predetermined sampling time intervals.

In the present invention, it is also preferable that each integrating circuit is arranged so as to sample and compute the input signal at predetermined sampling intervals of time, and where each integrating circuit comprises:

first amplifying means for amplifying the input signals;

adding means having two input terminals, the adding means for adding levels of signals applied to the input terminals, where an output of the first amplifying means is applied to one of the input terminals;

delaying means for producing an output of the adding means after a lapse of one or more of the sampling intervals of time; and second amplifying means for amplifying an output of the delaying means to apply as a positive feedback to the other input terminal of the adding means;

wherein a gain of the second amplifying means is to be less than one.

According to the present invention, each integrating circuit converts, for example, analog input signals into digital values at predetermined sampling intervals of time. Digital input signals obtained at the predetermined sampling intervals of time are amplified by the first amplifying means and are applied to the adding means. The output of the adding means is delayed by one or more sampling intervals of time, and thereafter, the delayed signal is amplified by the second amplifying means. Then, the amplified signal is applied as a positive feedback to the adding means. The gain of the second amplifying means is set to less than one so as to prevent oscillation. The components such as the first and second amplifying means, adding means and delaying means are operable synchronously with the sampling intervals of time. By varying the gain of the second amplifying means, the fall time constants of the integrating apparatus are determined.

According to the present invention, the integrating circuits are achieved by computations performed by microcomputers or the like. Each fall time constant may readily be determined as a value by varying the gain of the second amplifying means.

The present invention further provides an audio system comprising:

an audio source for outputting an audio signal;

attenuating means for attenuating the audio signal in response to a level of a control signal; and noise detecting means for outputting a noise signal in response to a noise level;

the audio system comprising the integrating apparatus, wherein the integrating circuits of the integrating apparatus receive the noise signal as an input signal, and the attenuating means receives the output signal of the selecting means as a control signal.

The present invention provides an audio system comprising:

an audio source;

attenuating means for attenuating audio signals from the audio source, an attenuation of the attenuating means being variable with a level of a control signal;

a microphone for detecting a noise;

a pair of integrating circuits for sharing an output of the microphone, where each of the pair of integrating circuits have different fall time constants; and selectively outputting means for selectively deriving an output having a lowest level from among outputs of the respective integrating circuits, and for applying the output having the lowest level as the control signal to the attenuating means.

According to the present invention, audio signals from an audio source such as a radio receiver or from means for playing tapes or other recording media are converted into audible sound via the attenuating means through, for example, a loudspeaker. The attenuating means makes an attenuation possible, which corresponds to the level of the control signal inputted into the attenuating means. The microphone derives out an output having a level corresponding to the noise level, and then the output of the microphone is shared between the pair of integrating circuits. An output having a lower level selected from among outputs of the respective integrating circuits are sent from the selectively outputting means and supplied to the attenuating means as the control signal of the attenuating means. Thus, when the noise level is high, the outputs of the integrating circuits increase, and the attenuation by the attenuating means is reduced to thereby increase the volume from the audio source which is converted into audible sound through the loudspeaker. Upon cessation or reduction of the noise, the output from the selectively outputting means reduces quickly to shorten its convergence time. Accordingly, the level of the control signal applied to the attenuating means lowers quickly to increase attenuation, which thereby lowers the level, at the point of conversion into audible sound, of the audio signals supplied from the audio source.

The microphone may be disposed adjacent the loudspeaker, or the microphone may be disposed fat away from the loudspeaker so as not to be susceptible to influences of the sound from the loudspeaker.

In another embodiment of the present invention, the attenuating means may be replaced with amplifying means for varying an amplifying gain so as to vary the audio signals from the audio source in response to the level of the control signal. When the attenuating means is used, the attenuating means is operable to reduce an attenuation when the level of the control signal is raised, which is when the noise level increases. When the amplifying means is used instead of the attenuating means, the amplifying means is operable to increase the amplifying gain when the level of the control signal is raised, which is when the noise level increases.

According to the present invention, in an on-board audio system, for example, an audio output level rises in a state of a high noise level while a vehicle is running. The audio output level never varies frequently, and thus, any variation of the audio output level is smooth, whereby it is possible to avoid a drift of the audio output level. Moreover, when the vehicle stops at a toll gate on an expressway, for example, the audio output level is lowered immediately to make the rider comfortable.

The present invention further provides a signal processing apparatus comprising:

one or more sensors for detecting a level of a physical or chemical value; and one of the integrating apparatuses to which the output of the sensor is supplied.

According to the present invention, one or more sensors are provided, and the one or more sensors detects the level of the physical value or detects the level of the chemical value. In a construction having a single sensor, the sensor is shared between the plurality of integrating circuits. In the construction having a plurality of sensors, the outputs of the respective sensors are individually supplied to the plurality of integrating circuits, respectively. The outputs of the sensors may be directly supplied to each of the integrating circuits. Also, in another embodiment of the present invention, a circuit such as a filter 38 (see FIG. 5) may be provided between one or more sensors and one or more integrating circuits, as described below. The above-mentioned microphone for detecting the noise may be employed as the sensor. In the construction having a plurality of sensors serving as the microphones, for example, one sensor is mounted in the vicinity of the ceiling of a vehicle such as an automobile to detect noise, and the other sensor is mounted on the floor of the vehicle to detect noise. The outputs of the respective sensors are supplied to each of two integrating circuits. An output of a lowest level is selected from among the outputs of the respective integrating circuits, and the lowest level output of the integrating circuits is output from the selectively outputting means. The sensor mounted on the ceiling detects a noise in the interior of the vehicle. The sensor mounted on the floor detects rumbles of an internal-combustion engine for driving the vehicle and rumbles of the body of the vehicle. Thus, on the basis of the outputs of the sensors having a different object to be detected, it is possible to avoid a drift in the outputs from the selectively outputting means, and moreover, to increase the fall convergence rate.

In another embodiment of the present invention, the sensor may have a construction for detecting a moving body, which is employed in radar or the like. Furthermore, the sensor may be a pressure sensor for detecting an inhalation air pressure of air for combustion in an internal-combustion engine, a sensor for detecting a current to be applied to a load, a sensor for detecting power consumption of a load, a sensor for detecting the level of a physical value other than the above values, or a sensor for detecting the level of a chemical value.

BRIEF DESCRIPTION OF THE DRAWINGS

Other and further objects, features, and advantages of the present invention will be more explicit from the following detailed description when taken with reference to the annexed drawings, in which.

DETAILED DESCRIPTION OF THE INVENTION

Figure 1:
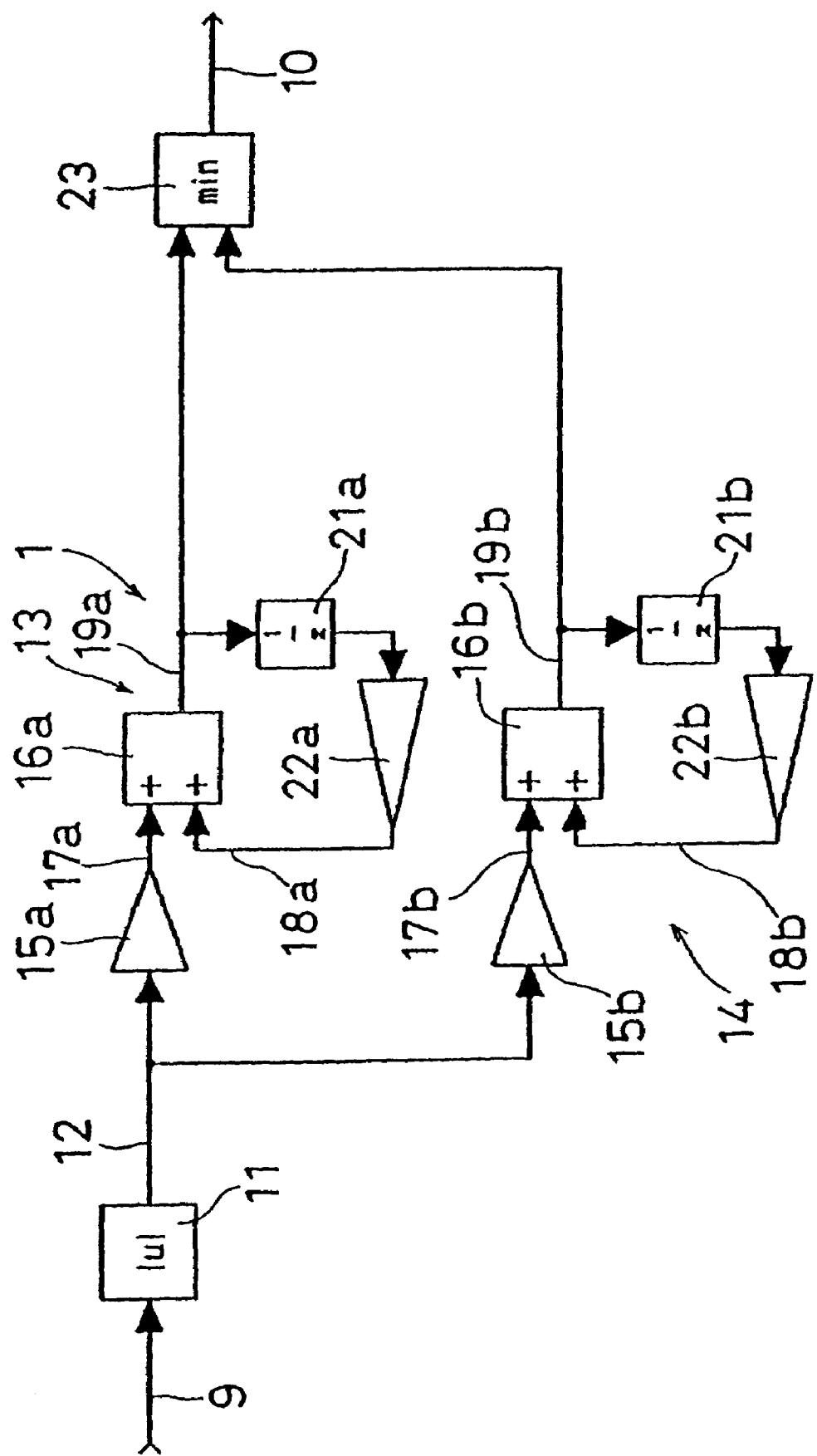
FIG. 1 is a block diagram showing an electrical construction of an integrating apparatus 1 according to a first embodiment of the present invention.

Now referring to the drawings, preferred embodiments of the invention are described below.

First Embodiment

Figure 2:
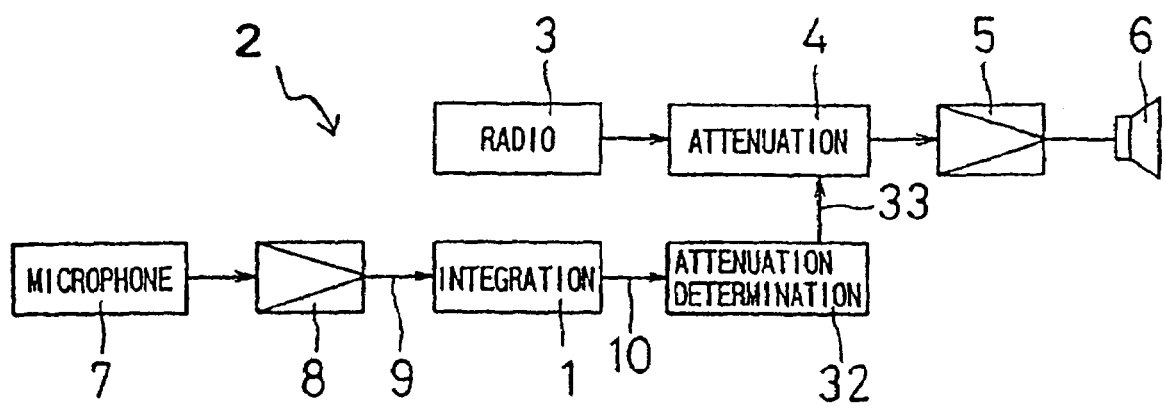
FIG. 2 is a block diagram showing an electrical construction of an on-board audio system 2 having the integrating apparatus 1 shown in FIG. 1.

FIG. 1 is a block diagram showing an electrical construction of an integrating apparatus 1 according to a first embodiment of the present invention. FIG. 2 is a block diagram showing an electrical construction of an on-board audio system 2 having the integrating apparatus 1 shown in FIG. 1. The on-board audio system 2 is mounted on a vehicle such as an automobile. An audio source 3 is a radio receiver or reproducing device, for example, for sending out audio signals. The reproducing device plays magnetic tapes, compact discs or the like to output audio signals. An output of the audio source 3 is applied to an attenuating means 4 known as an electronic volume. An audio output of the attenuating means 4 is amplified by an amplifying circuit 5, and the amplified audio output is converted into audible sound by a loudspeaker 6 disposed in a vehicle's interior.

The interior of the vehicle is further provided with a microphone 7 for sending out an output having a level corresponding to a noise level so as to supply the output to an amplifying circuit 8. An output of the amplifying circuit 8 is applied to the integrating apparatus 1 of the present invention through a line 9. An integrated output of the integrating apparatus 1 is applied as a control signal through a line 10 to an attenuation determining circuit 32. The attenuation determining circuit 32 sends out a control signal for determining an attenuation. An output of the attenuation determining circuit 32 is applied to the attenuating means 4 through a line 33.

The integrating apparatus 1 will now be described in greater detail with reference to FIG. 1. A signal indicating the noise level is applied from the line 9 to an absolute value circuit 11 shown in FIG. 1. The absolute value circuit 11 computes and outputs an absolute value of the noise level signal received through the line 9. The absolute value circuit 11 may be in the form of a full-wave rectifier circuit, for example. An output of the absolute value circuit 11 is applied through a line 12 to a first integrating circuit 13 and a second integrating circuit 14. These first and second integrating circuits 13 and 14 are similar in construction. Like components of each of the first and second integrating circuits 13 and 14 will be hereinafter identified with like reference numerals, with letters a and b affixed thereto, and only the reference numeral will be used in referring to a pair of such components. The noise level signal sent through the line 12 is applied to a first amplifying means 15 of each integrating circuit. An adding means 16 has two input terminals. The adding means 16 adds levels of signals applied to the two input terminals 17 and 18, and outputs the added result to a line 19. The input terminal 17 receives the output of the first amplifying means 15.

The added result signal of the adding means 16 sent out to the line 19 is applied to delaying means 21, which operates to delay the added result signal, and then the delayed signal is applied to a second amplifying means 22. An output of the second amplifying means 22 is applied to the other input terminal 18 of the adding means 16 as a positive feedback.

Each added result signal output from the adding means 16 to the line 19 is applied to a selectively outputting means 23. The selectively outputting means 23 derives an output having the lower signal level among the signals output on the lines 19a and 19b from the adding means 16a and 16b, respectively, and the selectively outputting means 23 supplies the output to the line 10 as a control signal.

The components 15-22 constituting the integrating circuits 13 and 14 may, for example, be accomplished by performing computations by processing circuits in the form of microcomputers or the like. In such a construction, analog signals output from the absolute value circuit 11 to the line 12 are applied to the integrating circuits 13 and 14 after being converted to digital values at predetermined sampling intervals of time by an analog-to-digital converter. The delaying means 21 delays the signals by one or more sampling intervals. In this embodiment, for example, the delaying means 21 delays the signals on the line 19 by one sampling interval, and the delayed signals are then applied to the second amplifying means 22.

The second amplifying means 22a in the first integrating circuit 13 may have a gain g22a set to a value less than one, e.g. g22a=0.9999. The first amplifying means 15a may have a gain g15a set so that a sum of signal levels at the input terminals 17a and 18a of the adding means 16a standardized by a level of the input signal on the line 12 does not exceed 1, e.g. g15a=0.002 in this embodiment. Similarly, the second amplifying means 22b in the second integrating circuit 14 may have a gain g22b, for example, set at g22b=0.9990. Further, the first amplifying means 15b has a gain g15b set such that a sum of signal levels at the input terminals 17b and 18b of the adding means 16b standardized by the input signal on the line 12 does not exceed 1, e.g. g15b=0.03. The audio signals on the line 12 may be digitized to 16 bits, for example. A sampling frequency Fs may be 44100 Hz, for example.

The first integrating circuit 13 has a time constant T expressed by the following equation $$T=n/Fs \qquad (1)$$

where n is the number of circulations made by a signal, under the condition of the sampling frequency Fs, through a closed loop formed by the adding means 16a, the delaying means 21a and the second amplifying means 22a, until the signal becomes −60 dB, for example. This time constant T is set to a value in the range of 5 to 10 seconds, for example. This time constant T applies also to the other integrating circuit 14.

In the first and second integrating circuits 13 and 14;

$$g22a>g22b \qquad (2)$$

The gains g22a and g22b of the second amplifying means 22a and 22b are in the following relationship:

$$g22a>g22b \qquad (3)$$

Thus, the time constant of the first integrating circuit 13 is large, and the time constant of the second integrating circuit 14 is less than the time constant of the first integrating circuit 13.

Figures 3A, 3B:
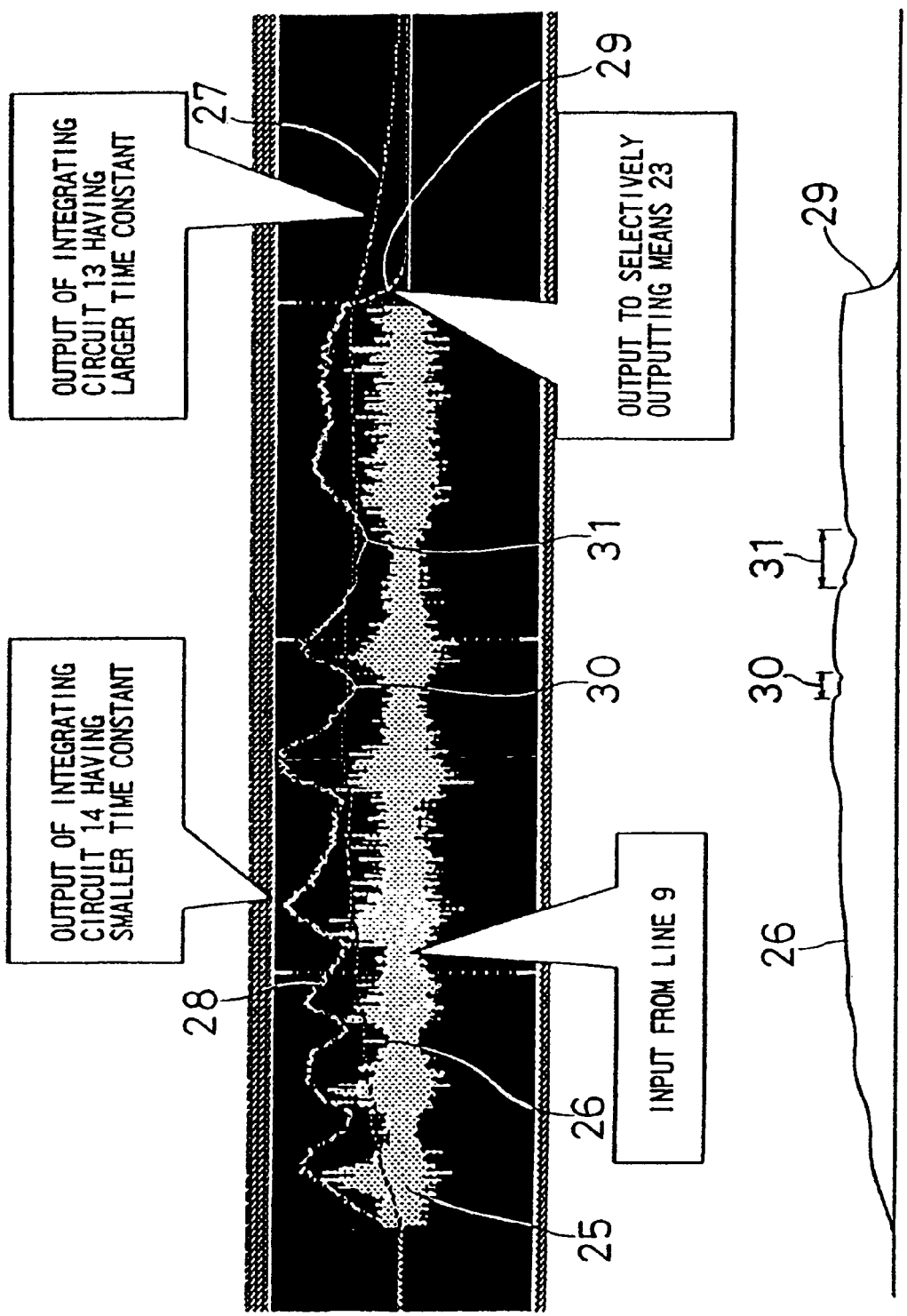
FIGS. 3A and 3B are waveform diagrams showing results of an experiment conducted by the inventor of the present invention.

FIGS. 3A and 3B are waveform diagrams showing results of an experiment conducted by the inventor of the present invention. A waveform denoted by reference numeral 25 in FIG. 3A represents a signal showing a noise level supplied from the microphone 7 to the line 9 through the amplifying circuit 8. Consequently, the first integrating circuit 13 outputs signals of waveforms shown by reference numerals 26 and 27 to the line 19a. The second integrating circuit 14 has a smaller time constant than the first integrating circuit 13, and thereby outputs to the line 19b an integrated output which varies frequently in response to the noise level, as shown by reference numerals 28, 29, 30 and 31. As a result, the selectively outputting means 23 selectively derives an output having a lowest level from among these signals 26-29. FIG. 3B shows a waveform of a signal output from the selectively outputting means 23 to the line 10. When the noise level is high, the output of the integrating circuit 13 having the larger time constant is sent out as shown by reference numeral 26 in FIG. 3B.

Upon cessation of the noise level, such as when the vehicle stops, for example, the output of the integrating circuit 14 having the smaller time constant is output as the output from the selectively outputting means, as shown by reference numerals 29, 30 and 31. The attenuating means 4 described with reference to FIG. 2 makes the attenuation possible, by the attenuation determining circuit 32, which corresponds to the level of the control signal with the waveform shown in FIG. 3B output to the line 10. The attenuation is smaller when the control signal level is higher. Thus, the higher the noise level, the higher the level of audio output is made from the loudspeaker 6. When the vehicle stops to reach the noise level to zero or a value close to zero, the attenuation by the attenuating means 4 increases sharply as shown in the waveform 29, thereby reducing the audio level of the loudspeaker 6.

Second Embodiment

Figure 4:
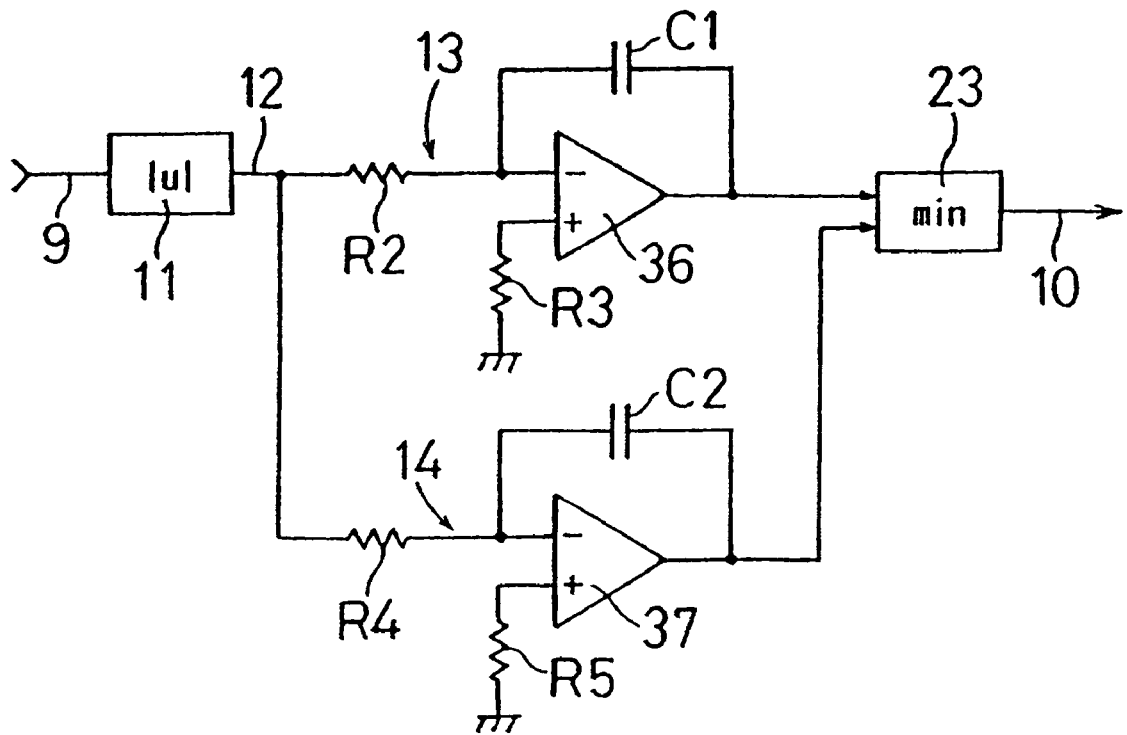
FIG. 4 is a block diagram showing an electrical construction according to a second embodiment of the present invention.

FIG. 4 is a block diagram showing an electrical construction according to a second embodiment of the present invention. The second embodiment is similar to the first embodiment except for the reasons identified below. Still, the corresponding elements between the first and second embodiments are denoted by the same reference numerals. In the first embodiment shown in FIG. 1 as described above, the signals are digitally processed and computed by a microcomputer or the like. In the second embodiment as illustrated in FIG. 4, however, the integrating circuits 13 and 14 are realized by analog circuits, and the absolute value circuit 11 and the selectively outputting means 23 are also realized by analog circuits. In the integrating circuit 13 of FIG. 4, a capacitor C1 for integration is connected between an inverse input terminal and an output terminal of a computing amplifier 36, and the inverse input terminal is connected to the line 12 through which the output of the absolute value circuit 11 is output via a resistor R2. The non-inverse input terminal of the computing amplifier 36 is connected to a resistor R3 and is grounded. A time constant of the integrating circuit 13 is determined by a capacitance of the capacitor C1 and a resistance of the resistor R2. Like the integrating circuit 13, the integrating circuit 14 also includes a computing amplifier 37, a capacitor C2, and resistors R4 and R5, and has a time constant which is determined by a capacitance of the capacitor C2 and a resistance of the resistor R4. The construction and operation of the integrating apparatus according to the second embodiment are the same as the above-mentioned first embodiment. The present invention includes not only the construction of FIG. 1, as described above, for digital-processing the signal from the line 9, but also the construction of FIG. 4 for analog-processing the signal from the line 9.

Third Embodiment

Figure 5:
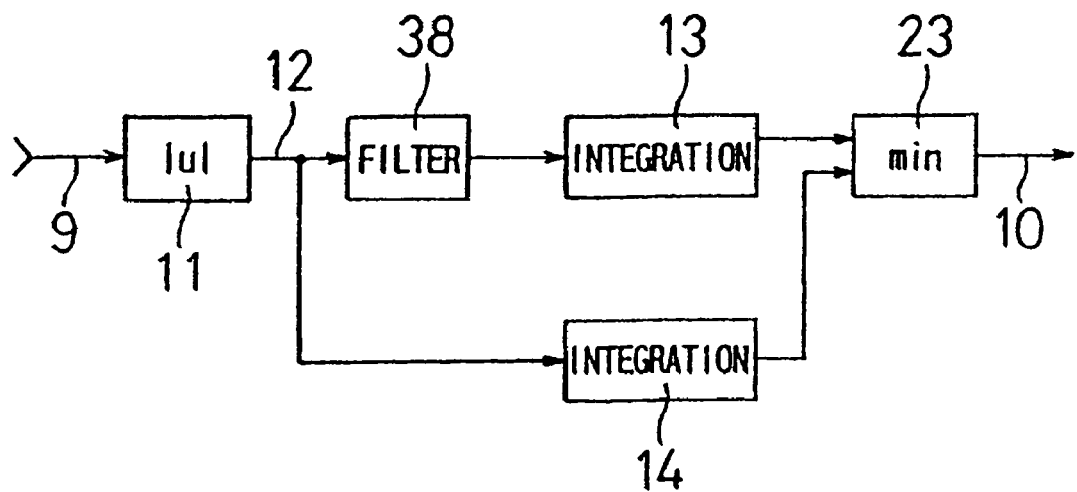
FIG. 5 is a block diagram showing an electrical construction according to a third embodiment of the present invention.

FIG. 5 is a block diagram showing an electrical construction according to a third embodiment of the present invention.

The third embodiment is similar to the above-mentioned first and second embodiments, and the corresponding elements between these embodiments are denoted by the same reference numerals. Especially in this third embodiment, the signal from the line 12 is supplied to the integrating circuit 13 via a filter 38. The filter 38 may be a low-pass filter, a band-pass filter, or a high-pass filter. The filter 38 has a time constant which is different from the respective time constants of the integrating circuits 13 and 14, and the time constant of the filter 38 serves for eliminating noise in order to prevent the integrating circuit 13 from failing to operate properly due to the noise.

Fourth Embodiment

Figure 6:
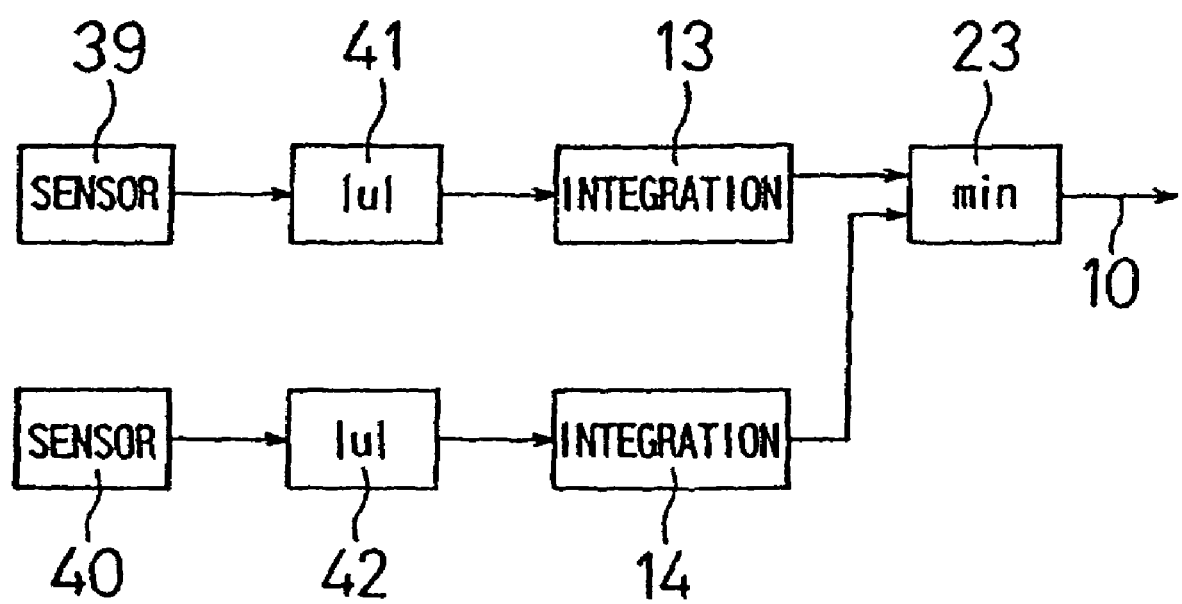
FIG. 6 is a block diagram showing a fourth embodiment of the present invention.

FIG. 6 is a block diagram showing a fourth embodiment of the invention. The fourth embodiment is similar to the above-mentioned embodiments, and the corresponding parts between the embodiments are denoted by the same reference numerals. A plurality of (in the fourth embodiment, for example, two) sensors 39 and 40 detect a level of a physical value or a level of a chemical value. Outputs of the respective sensors 39 and 40 are supplied to absolute value circuits 41 and 42, respectively. The absolute value circuits 41 and 42 each has the same construction as those of the above-mentioned absolute value circuit 11. The sensor 39 is provided with the absolute value circuit 41 and the integrating circuit 13. The sensor 40 is provided with the absolute value circuit 42 and the integrating circuit 14. Outputs of the integrating circuits 13 and 14 are supplied to the selectively outputting means 23, which, as described above, outputs the lowest level among the levels of integrated outputs from the integrating circuits 13 and 14 to the line 10. The present invention can be thus embodied in relation to various applications.

The integrating apparatus according to the present invention is not limited to an incorporation into an on-board audio system. This apparatus may find wide application, including detection of a flow rate of a fluid such as water.

The present invention may be embodied in other specific forms without departing from the spirit or essential characteristics thereof. The present embodiments are therefore to be considered in all respects as illustrative and not restrictive. The scope of the present invention is indicated by the appended claims rather than by the foregoing description, and all changes which come within the meaning and the range of equivalency of the claims are therefore intended to be embraced therein.

What is claimed is:

1. An integrating apparatus comprising:
   a plurality of integrating circuits, wherein each of said integrating circuits integrates an input signal and outputs an integrated signal; and
   an output unit that selectively derives an output having a lowest level from among integrated signals output from said plurality of integrating circuits;
   wherein said plurality of integrating circuits each have a different fall time constant, and
   wherein the same input signal is inputted to each of said plurality of integrating circuits.

2. The integrating apparatus according to claim 1, wherein said plurality of integrating circuits are each controlled so that an average value of the output level becomes higher as the fall time constant becomes smaller.

3. The integrating apparatus according to claim 1, wherein each of said plurality of integrating circuits integrates an unfiltered input signal.

4. An audio system comprising:
   the integrating apparatus according to claim 1;
   a detecting unit that detects a noise signal to a noise level and outputs an input signal;
   an audio source that outputs an audio signal; and
   an attenuating unit that attenuates the audio signal in response to a level of a control signal outputted by said output unit of said integrating apparatus.

5. The audio system according to claim 4, wherein said plurality of integrating circuits of said integrating apparatus are each controlled so that an average value of the output level becomes higher as the fall time constant becomes smaller.

* * * * *